(12) United States Patent
Lin (10) Patent No.: US 9,053,949 B2
(45) Date of Patent: Jun. 9, 2015

(54) SEMICONDUCTOR DEVICE AND ASSOCIATED METHOD WITH HEAT SPREADER HAVING PROTRUSION

(75) Inventor: Yu-Yu Lin, New Taipei (TW)

(73) Assignees: GLOBAL UNICHIP CORPORATION, Hsinchu (TW); TAIWAN SEMICONDUCTOR MANUFACTURING CO., LTD, Hsin-Chu (TW)

( * ) Notice: Subject to any disclaimer, the term of this patent is extended or adjusted under 35 U.S.C. 154(b) by 0 days.

(21) Appl. No.: 13/548,311

(22) Filed: Jul. 13, 2012

(65) Prior Publication Data
US 2013/0032937 A1 Feb. 7, 2013

(30) Foreign Application Priority Data

Aug. 2, 2011 (TW) .............................. 100127470 A (51) Int. Cl.
  *H01L 23/10* (2006.01)
  *H01L 25/065* (2006.01)
  *H01L 23/367* (2006.01)
  (Continued)

(52) U.S. Cl.
  CPC .......... *H01L 25/0655* (2013.01); *H01L 23/367* (2013.01); *H01L 23/49816* (2013.01); *H01L 25/105* (2013.01); *H01L 24/13* (2013.01); *H01L 24/16* (2013.01); *H01L 24/29* (2013.01); *H01L 24/32* (2013.01); *H01L 24/81* (2013.01); *H01L 24/83* (2013.01); *H01L 24/92* (2013.01); *H01L 2224/131* (2013.01); *H01L 2224/16227* (2013.01); *H01L 2224/2919* (2013.01); *H01L 2224/32245* (2013.01); *H01L 2224/73253* (2013.01); *H01L 2224/81191* (2013.01); *H01L 2224/81801* (2013.01); *H01L 2224/8385* (2013.01); *H01L 2224/92225* (2013.01); *H01L 25/16* (2013.01); *H01L 25/18* (2013.01); *H01L 2225/1005* (2013.01); *H01L 2224/16225* (2013.01)

(58) Field of Classification Search
  USPC ............ 257/737, 777, E23.068, 690, E23.01,
       257/E23.011, E21.499, 706, E23.08, 98,
       257/E33.058; 438/26, 106–123
  See application file for complete search history.

(56) References Cited

U.S. PATENT DOCUMENTS 6,731,009 B1   5/2004  Jones et al.
7,074,696 B1*  7/2006  Frankowsky et al. ......... 438/464
(Continued)

OTHER PUBLICATIONS

Taiwan Patent Office, "Office Action", Feb. 20, 2014.
(Continued)

*Primary Examiner* — Mohammad Islam
*Assistant Examiner* — Ankush Singal
(74) *Attorney, Agent, or Firm* — WPAT, PC; Justin King (57) ABSTRACT

The invention provides a semiconductor device and associated method, which includes a substrate, a first die, multiple sub-package systems surrounding the first die, and a heat spreader. The first die and the sub-package systems are installed on a same surface of the substrate, wherein projections of the first die and each sub-package system on the surface partially overlap, and have a portion not overlapping. Each of the sub-package systems includes an interposer and multiple second dice installed on the interposer by way of flip-chip. The heat spreader includes a protrusion portion and a dissipation plate; the dissipation plate covers the first die and the sub-package systems, and the protrusion portion is set between the dissipation plate and the first die.

13 Claims, 10 Drawing Sheets

(51) Int. Cl.
*H01L 25/10* (2006.01)
*H01L 23/498* (2006.01)
*H01L 23/00* (2006.01)
*H01L 25/16* (2006.01)
*H01L 25/18* (2006.01)

(56) References Cited

U.S. PATENT DOCUMENTS

| | | | |
|---|---|---|---|
| 7,279,795 B2 | 10/2007 | Periaman et al. | |
| 7,445,962 B2 | 11/2008 | Choi et al. | |
| 7,683,469 B2 | 3/2010 | Oh et al. | |
| 7,705,449 B2 * | 4/2010 | Baek et al. | 257/723 |
| 8,080,874 B1 * | 12/2011 | Werner et al. | 257/723 |
| 2006/0087009 A1 * | 4/2006 | Yang | 257/675 |
| 2008/0284018 A1 * | 11/2008 | Chainer | 257/738 |
| 2009/0213541 A1 * | 8/2009 | Butterbaugh et al. | 361/689 |
| 2009/0219698 A1 * | 9/2009 | Chao | 361/718 |

OTHER PUBLICATIONS

State Intellectual Property Office of the People's Republic of China, "Office Action", Sep. 26, 2014.

* cited by examiner

SEMICONDUCTOR DEVICE AND ASSOCIATED METHOD WITH HEAT SPREADER HAVING PROTRUSION

This application claims the benefit of Taiwan Patent Application No. 100127470, filed Aug. 2, 2011, the subject matter of which is incorporated herein by reference.

FIELD OF THE INVENTION

The present invention relates to a semiconductor device and associated method, and more particularly, to a semiconductor device and associated method integrating multiple dice to satisfy demands of integration density and heat dissipation.

BACKGROUND OF THE INVENTION

Semiconductor devices are one of the most important hardware foundations of modern information society. A die (a bare chip) is an essential element of a semiconductor device; different dice exchange signals and information to accomplish integrated functions of an electronic system. To implement an electronic system with smaller dimensions and higher integration density, modern semiconductor device integrates multiple dice in a same package, such as a system in package (SIP). For example, the package on package (PoP) technology perpendicularly stacks a die package over another die package to integrate multiple dice.

However, semiconductor devices of known package arts still surfers from pitfalls such as poor heat dissipation.

SUMMARY OF THE INVENTION

To overcome disadvantages of prior art, an objective of the invention is providing a semiconductor device satisfying demands of integration density and heat dissipation, the semiconductor device includes a substrate, one or more first die or dice, one or more sub-package system(s) and a heat spreader. The substrate has a first surface and a plurality of external interconnectors, the first die is installed on the first surface opposite to the surface on which the external interconnectors are installed.

Each sub-package system is installed on the first surface; a projection of the sub-package system on the first surface and a projection of the first die on the first surface partially overlap, and have a portion not overlapping. Each sub-package system includes one or more second die (or dice), a plurality of interconnectors and an interposer. The second die can be a bare chip, or a packaged silicon. In an embodiment of the sub-package system, the second die is a bare chip installed on the interposer by way of flip-chip, i.e., by bumps under the bare chip. And/or, the second die can be a package silicon installed on the interposer by pins and solder balls, such as solder balls of a ball grid array, BGA. The interposer is set between the second die and the first surface of the substrate, and the interconnectors and the second die are installed on opposite surfaces of the interposer. In association with the interconnectors of each sub-package system, plural contacts are installed on the first surface of the substrate; each interconnector of each sub-package system is coupled between the associated contact and the interposer.

In an embodiment, the first die is installed on the first surface of the substrate by way of flip-chip; on the first surface, a height of the first die along a first direction is lower than a height of each interconnector of each sub-package system along the first direction.

The heat spreader includes a protrusion portion, a dissipation plate and one or more side wall(s); the dissipation plate covers over the first die and each sub-package system, the protrusion portion is set between the first die and the dissipation plate, and each side wall is set between the dissipation plate and the first surface.

An objective of the invention is offering a method providing (such as producing, manufacturing or implementing) aforementioned semiconductor device, including: installing the first die on the first surface of the substrate, installing the second die on the interposer to assemble the sub-package system by way of flip-chip if the second die is a bare chip, or by coupling conductors (e.g., pins and/or solder balls) of the second die if the second die is a packaged silicon; installing each sub-package system on the first surface by coupling each interconnector of the sub-package system to associated contact on the substrate; installing the heat spreader and attaching the plural external interconnectors to the substrate.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

Figure 1:
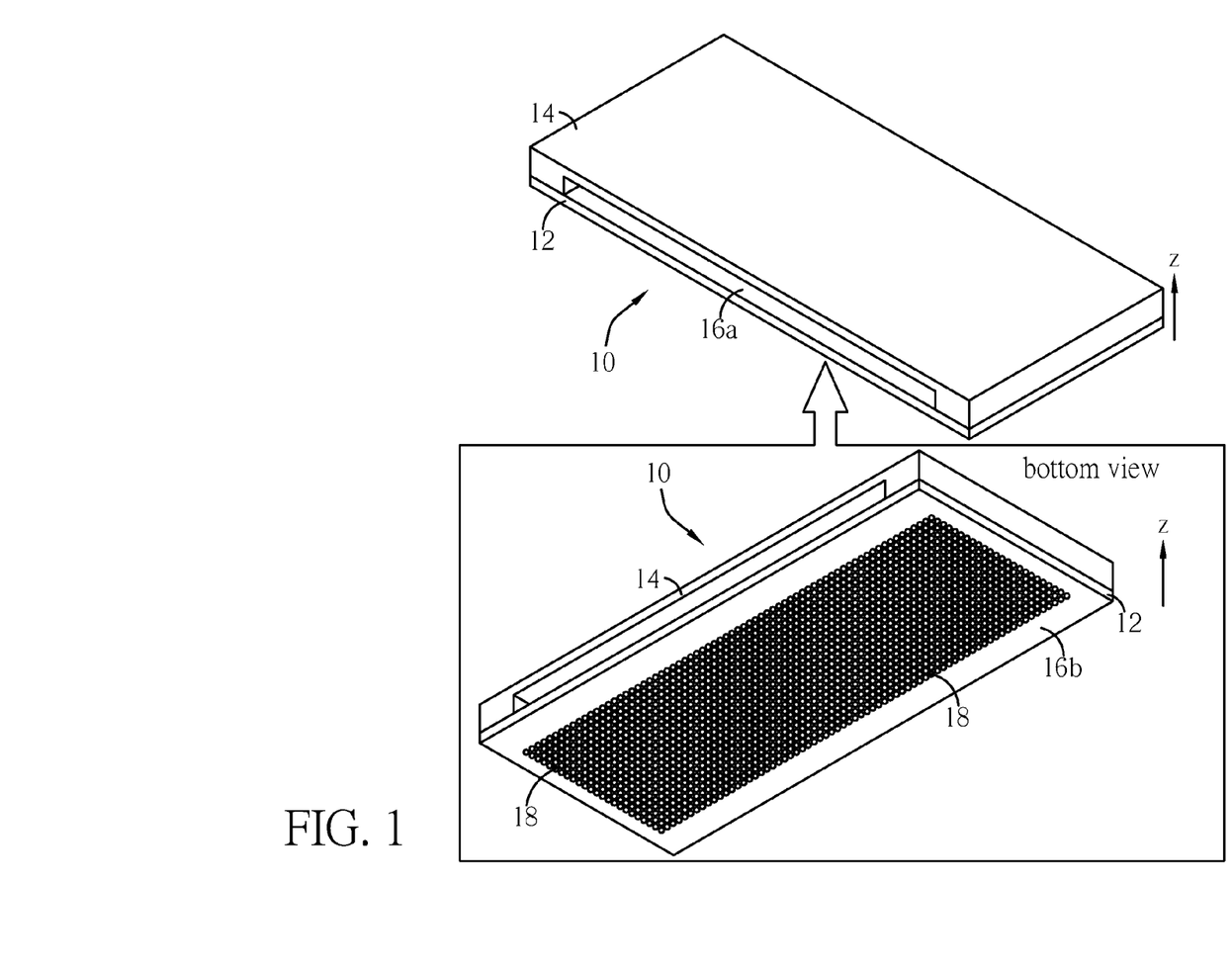
FIG. 1 illustrates, by three-dimensional views, a semiconductor device according to an embodiment of the invention.
Figure 2:
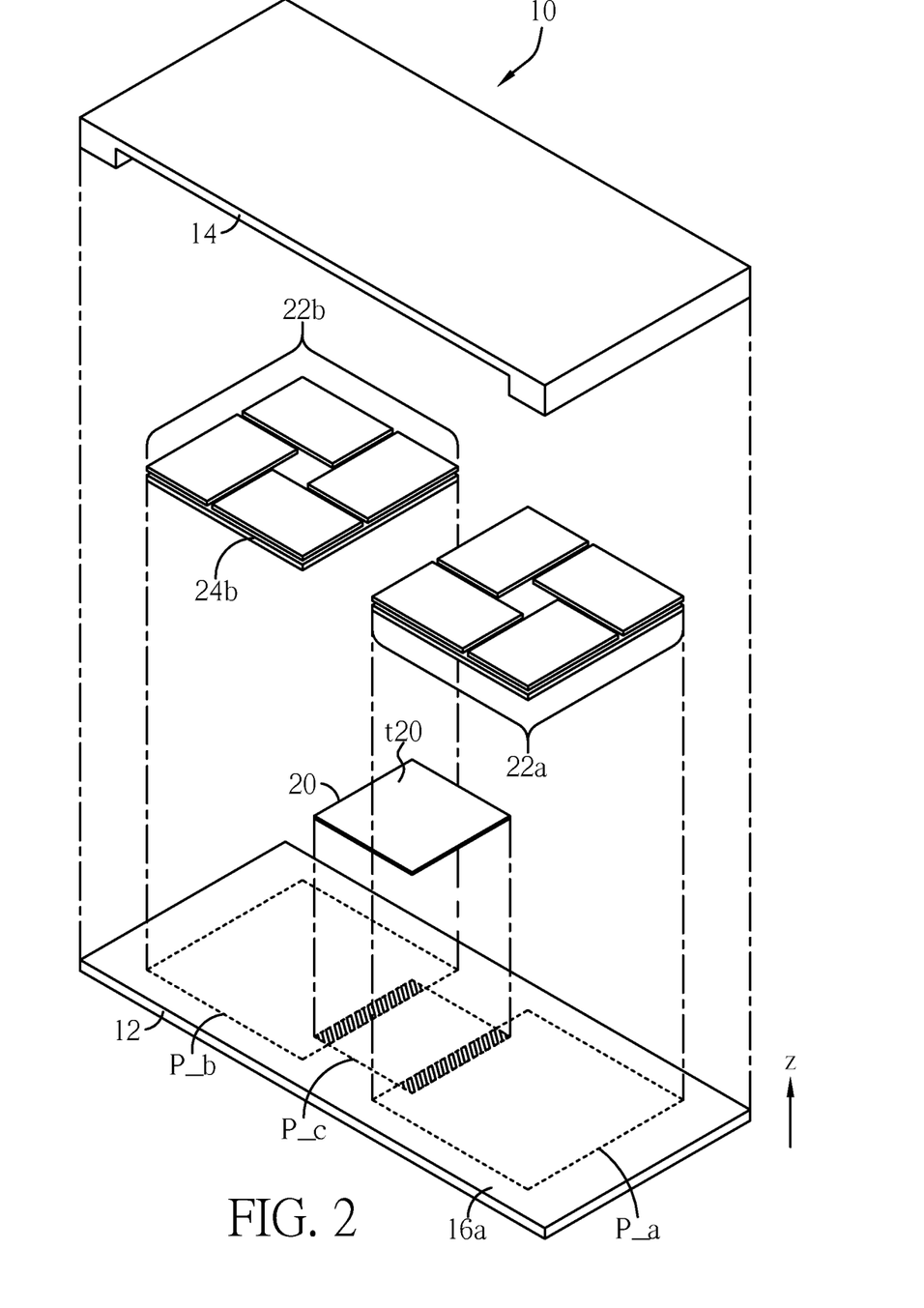
FIG. 2 illustrates main components of the semiconductor device shown in FIG. 1.
Figure 3:
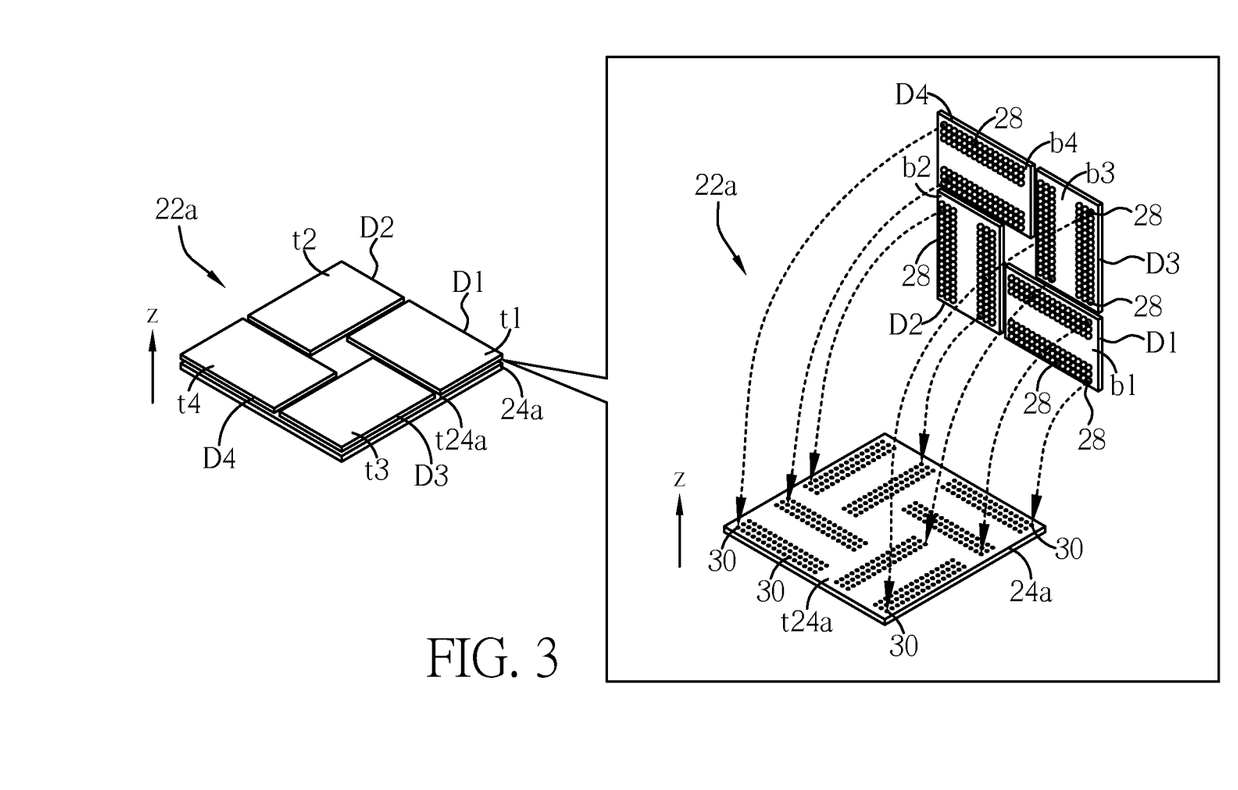
FIG. 3 illustrates an architecture of the sub-package system shown in FIG. 2 according to an embodiment of the invention.
Figure 4:
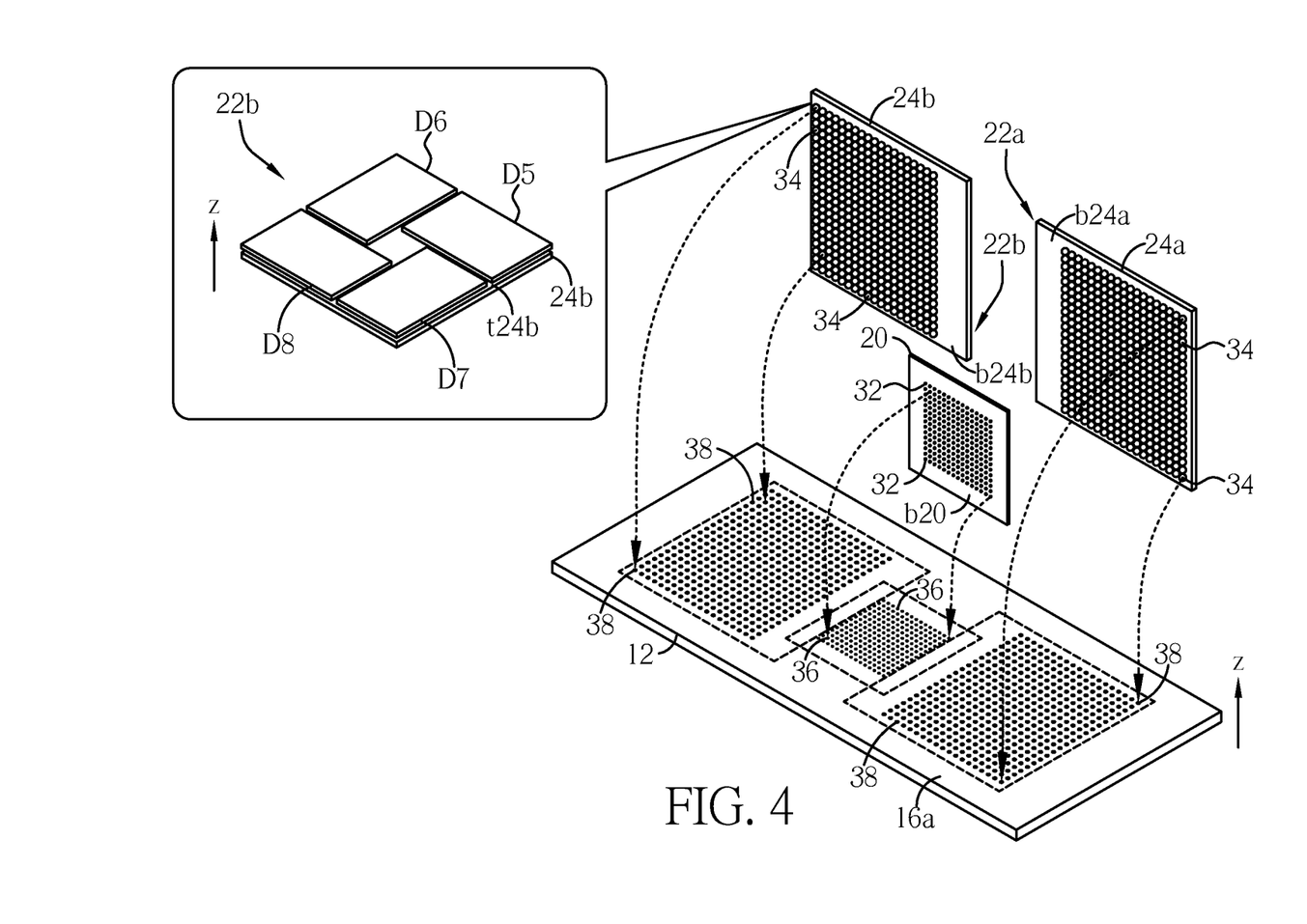
FIG. 4 illustrates an embodiment for arranging the die in FIG. 2 and the sub-package systems on the substrate.
Figure 5:
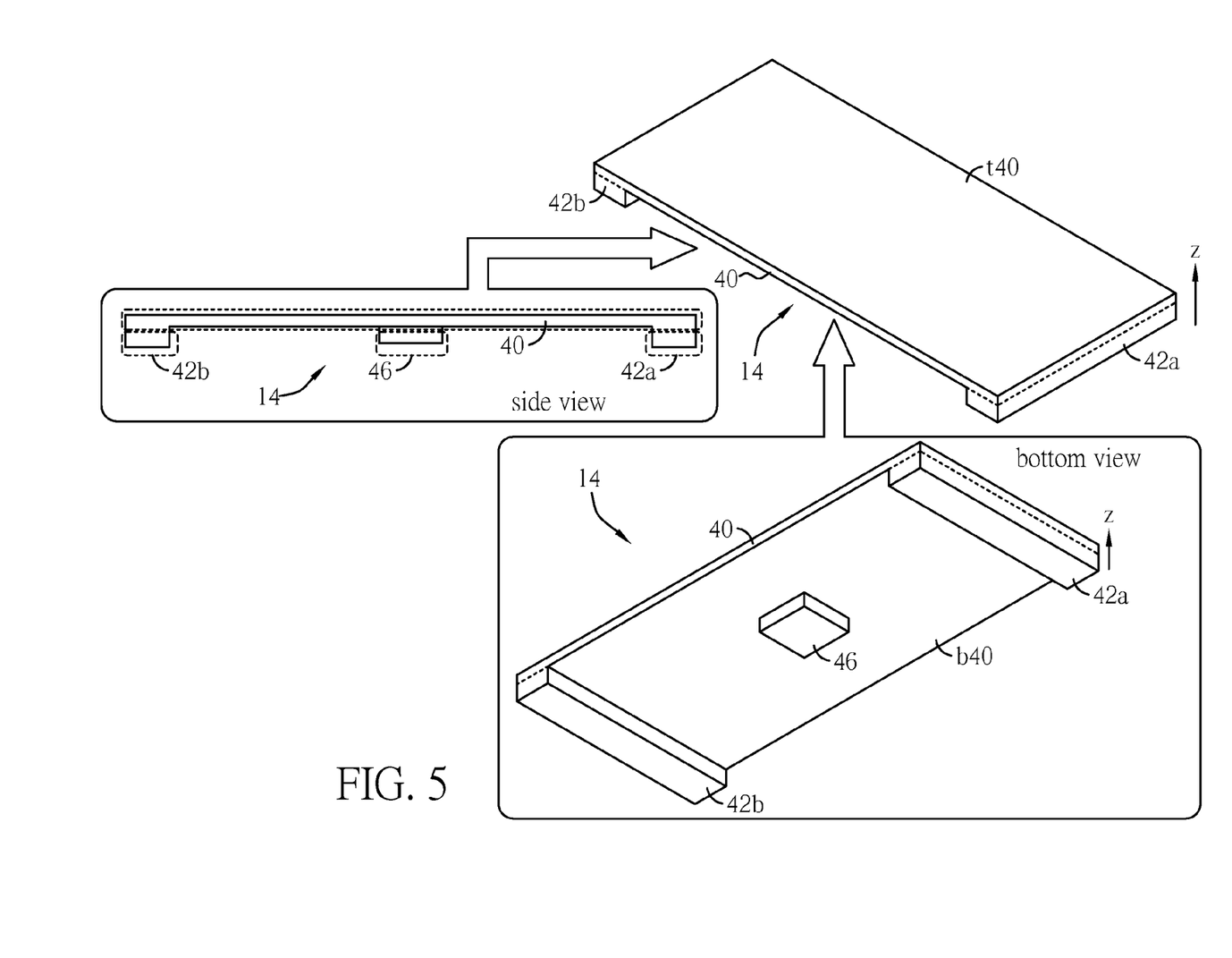
FIG. 5 illustrates different views of the heat spreader in FIG. 2 according to an embodiment of the invention.
Figure 6:
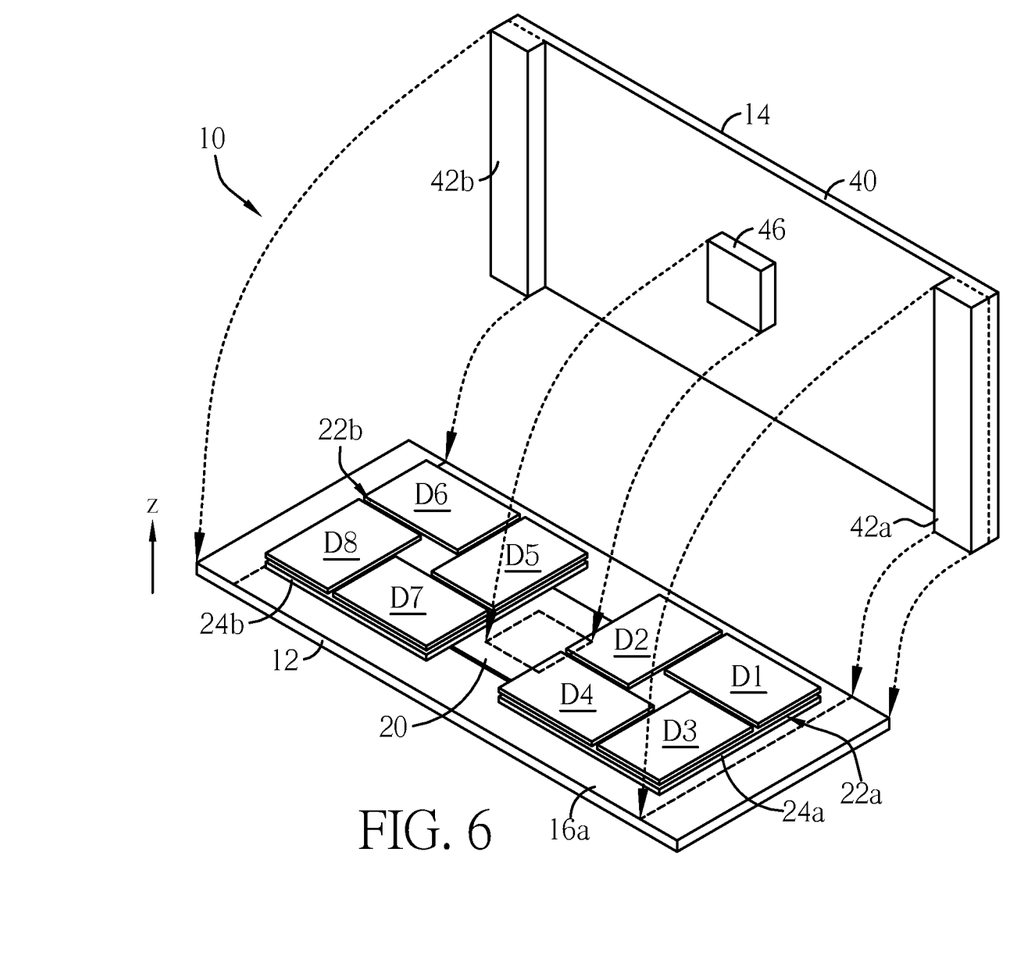
FIG. 6 illustrates an embodiment for arranging the heat spreader in FIG. 5 to the substrate in FIG. 2.
Figure 7:
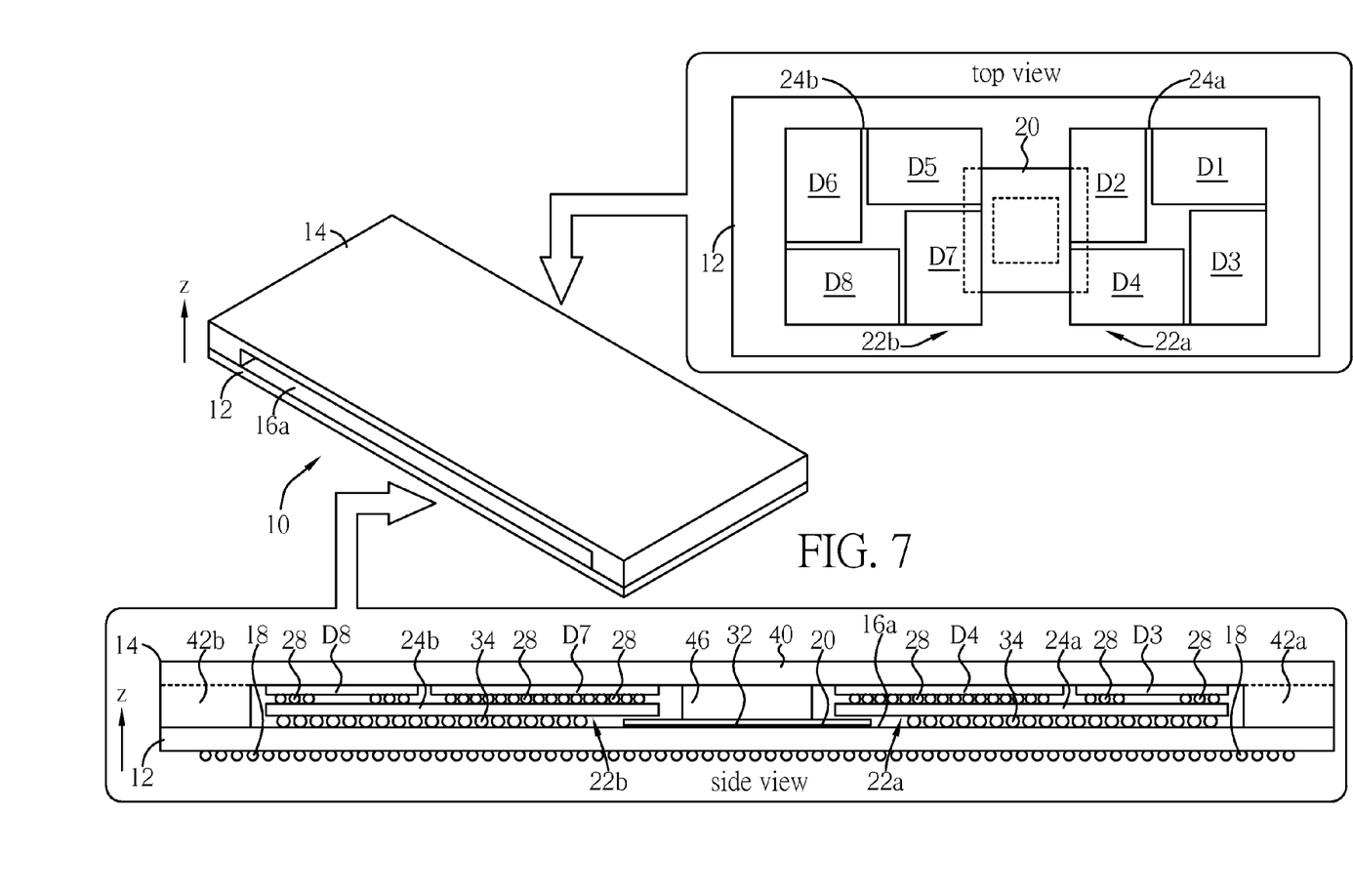
FIG. 7 illustrates different views of the semiconductor in FIG. 1.

Please refer to FIG. 1 to FIG. 7. FIG. 1 demonstrates, by three-dimensional views, a semiconductor device 10 according to an embodiment of the invention; FIG. 2 illustrates main components of the semiconductor device 10, including a substrate 12, a die 20, one or more sub-package system(s), e.g., two sub-package systems 22a and 22b, and a heat spreader 14. Taking the sub-package system 22a as an example, FIG. 3 illustrates an architecture embodiment of the sub-package system, and FIG. 4 illustrates arrangement of the die 20, the sub-package systems 22a and 22b on the substrate 12. FIG. 5 illustrates an embodiment of the heat spreader 14 with views of different angles, and FIG. 6 illustrates arrangement of the heat spreader 14 on the substrate 12. FIG. 7 illustrates structure of the semiconductor device 10 with different views.

As shown in FIG. 1, the substrate 12 has two opposite surface 16a and 16b (respectively as a top surface and a bottom surface) along a z-direction, and includes a plurality of interconnectors 18 on the surface 16b as external interconnectors. The die 20 (a first die) and the sub-package systems 22a and 22b are installed on the surface 16a (a first surface), as shown in FIG. 2; that is, the interconnectors 18 and the die 20 are installed on opposite surfaces of the substrate 12. Each of the interconnectors 18 can be a solder ball, a pin or a contact.

As shown in FIG. 2, on the surface 16a, projections P_a, P_b of the sub-package systems 22a, 22b and a projection P_c of the die 20 partially overlap (shown as areas shaded by slash lines), and have a portion not overlapping. As shown in FIG. 3 and FIG. 4, the sub-package system 22a includes an interposer 24a, a plurality of interconnectors 34 (FIG. 4), and one or more die/dice (as second die/dice, each can be a bar chip and/or a packaged silicon), such as dice D1 to D4. Each of the dice D1 to D4 has two opposite surface along the z-direction; for example, the die D1 has surfaces t1 and b1 (as a top surface and a bottom surface), the die D2 has surfaces t2 and b2, the die D3 has surfaces t3 and b3, and the die D4 has surfaces t4 and b4. On the surfaces b1 to b4, each of the dice D1 to D4 has a plurality of interconnectors 28. For each die of the dice D1 to D4, if any one of them is a bare chip, the interconnectors 28 on its bottom surface are bumps under the bar chip; if any one of them is a packaged silicon, the interconnectors 28 on its bottom surface can be solder balls of BGA.

As illustrated by FIG. 3 and FIG. 4, the interposer 24a has two opposite surfaces t24a and b24a along the z-direction (FIG. 4); there are plural contacts 30 on the surface t24a, each of the contacts 30 is associated with one of the interconnector 28. In the sub-package system 22a, each of the dice D1 to D4 are installed on the interposer 24a by coupling (connecting, soldering) each interconnector 28 and its associated contact 30 (also shown in the side view in FIG. 7). That is, the dice D1 to D4 are installed on the interposer 24a by way of flip-chip; the surfaces b1 to b4 of the dice D1 to D4 have semiconductor active regions (not shown) on which the interconnectors 28 are set; each of the interconnectors 28 can be a bump of a grid array, a solder ball, a pin or a contact.

Contrary to the Dice D1 to D4 set on the surface t24a, the interconnectors 34 are installed on the opposite surface t24b of the interposer 24a, as shown in FIG. 4. Each of the interconnectors 34 can be a solder ball, a pin or a contact.

Similar to the sub-package system 22a, the sub-package system 22b includes an interposer 24b, a plurality of interconnectors 34 and one or more die/dice, e.g., dice D5 to D8, as shown in FIG. 4. Along the z-direction, the interposer 24b has two opposite surfaces t24b and b24b; the dice D5 and D8 are installed on the surface t24b, and the interconnectors 34 are set on the surface b24b.

As shown in FIG. 4, the substrate 12 further includes a plurality of contacts 38 on the surface 16a; each contact 38 is associated with one of the interconnectors 34 to fit it. The sub-package systems 22a and 22b are installed on the substrate 12 by connecting (soldering) the interconnectors 34 and associated contacts 38 (also shown in side view of FIG. 7). That is, in the semiconductor device 10, the interposer 24a is set between the dice D1 to D4 and the surface 16a of the substrate 12, and the interconnectors 34 of the sub-package system 22a are coupled between the contacts 38 and the interposer 24a. Similarly, the interposer 24b is set between the dices D5 to D8 and the surface 16a, and the interconnectors 34 of the sub-package system 22b are between the contacts 38 and the interposer 24b.

In an embodiment, the die 20 can be installed on the surface 16a of the substrate 12 by way of flip-chip. The die 20 has two opposite surfaces t20 (FIGS. 2) and b20 (FIG. 4) along the z-direction. As shown in FIG. 4, the die 20 includes a plurality of interconnectors 32 (e.g., solder balls, pins or contacts) on the surface b20; correspondingly, the substrate 12 includes a plurality of contacts 36 on the surface 16a, each of the contact 36 fits one of the interconnectors 32. The die 20 is installed on the surface 16a by coupling the interconnectors 32 and the associated contacts 36. As shown in the side view of FIG. 7, a height of the die 20 along the z-direction is lower than a height of each interconnector 34 of the sub-package systems 22a and 22b along the z-direction, so the die 20 can be set under the interposers 24a and 24b (also shown in the top view of FIG. 7).

As shown in FIG. 5, the heat spreader 14 includes a protrusion portion 46, a dissipation plate 40 and one or more side wall(s), e.g., side walls 42a and 42b. The dissipation plate 40 has two opposite surfaces t40 and b40 along the z-direction; from the surface b40, the protrusion portion 46 directs along a direction opposite to the z-direction. As illustrated by FIG. 6 and FIG. 7, the dissipation plate 40 covers the die 20 and the sub-package systems 22a and 22b, the protrusion portion 46 is set between the die 20 and the dissipation plate 40, and each of the side walls 42a and 42b is set between the dissipation plate 40 and the surface 16a of the substrate 12.

The heat spreader 14 can be made by materials of high heat conduction coefficient, e.g. metal, to dissipate heat for the dice 20 and D1 to D8. For example, the surface b40 of the dissipation plate 40 can be directly or indirectly (through a heat conductive adhesive layer) attached to the surfaces t1 to t8 of the dice D1 to D8, and the protrusion portion 46 can be (directly or indirectly) attached to the surface t20 of the die 20; accordingly, heat generated by operation of the die 20 is conducted to the dissipation plate 40 by the protrusion portion 46, and is thus dissipated by the dissipation plate 40. The surface t40 of the dissipation plate 40 and/or the side walls 42a and 42b can further have structures, like fins, to enhance heat dissipation.

In the embodiment of FIG. 1 to FIG. 7, the interposers 24a and 24b carry the dice D1 to D8. In another embodiment, the interposer 24a and 24b not only carry dice, but also carry other kinds of electric elements (not shown), such as passive elements (resistors, capacitors and/or inductors, etc).

According to description of FIG. 1 to FIG. 7, the interposers 24a and 24b of the sub-package systems 22a and 22b partially extend above the die 20, so the areas for the interposers 24a and 24b to carry dice/electric elements are expanded; therefore, the interposers 24a and 24b can carry more dice/electric elements to increase integration density of the semiconductor device 10. Furthermore, the interposers 24a and 24b do not fully cover the die 20, so the protrusion portion 46 of the heat spreader 14 can extend to the die 20 to fulfill heat dissipation demand of the die 20.

Figure 8:
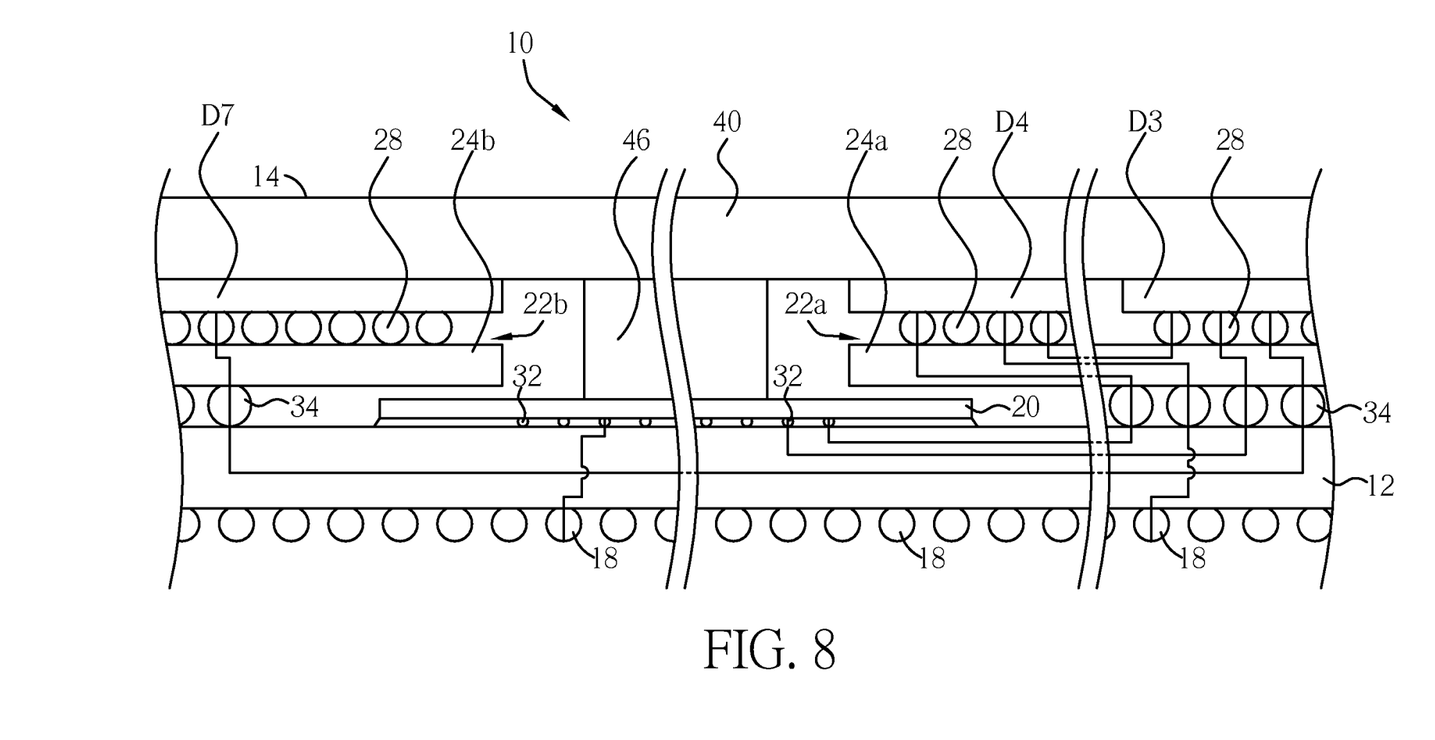
FIG. 8 illustrates various conduction paths for electric interconnections within the semiconductor device in FIG. 1.

Following the embodiment of FIG. 1 to FIG. 7, please refer to FIG. 8 illustrating electric conduction path of the semiconductor device 10 by a side view. The substrate 12 and the interposer 24a and 24b include one or more conductive layer (s), such as metal layer(s) (not shown), to form various kinds of electric conduction paths with the interconnectors 28, 32 and 34, such that the dice 20 and D1 to D8 are electrically coupled to each other, and also electrically coupled to external circuitry, such as circuit boards or another semiconductor devices, through the interconnectors 18. For example, the die in the sub-package system, e.g., the die D3 or D4 in the sub-package system 22a, can be electrically coupled to the die 20 via the interconnectors 28, the interposer 24a, the interconnectors 34, the substrate 12 and the interconnectors 32, so the die in the sub-package system can exchange (transmit and/or receive) information and signals with the die 20.

The die 20 is electrically coupled to the external interconnectors 18 through the interconnectors 32 and the substrate 12, so the die 20 can exchange information and signals with external circuitry, and/or drain operation power from external circuitry. Similarly, any die in each sub-package system, e.g., the die D4 in the sub-package system 22a, can be electrically coupled to the external interconnectors 18 via the interconnectors 28, the interposer 24a, the interconnectors 34 and the substrate 12, hence the die in the sub-package system can exchange information and signals with external circuitry, and/or drain operation power from external circuitry.

Different dice in a same sub-package system, e.g., the dice D3 and D4 in the sub-package system 22a, are electrically coupled to each other for signal and data exchange via the interconnectors 28 of the die D3, the interposer 24a and the interconnectors 28 of the die D4. Similarly, different dice in different sub-package systems, such as the die D3 in the sub-package system 22a and the die D7 in the sub-package system 22b, are electrically coupled to each other to exchange signals via the interconnectors 28 of the die D3, the interposer 24a, the interconnectors 34 of the interposer 24a, the substrate 12, the interconnectors 34 of the interposer 24b, the interposer 24b and the interconnectors 28 of the die D7.

In an embodiment of the semiconductor device 10, the die 20 can be a processer (a controller), and the dice D1 to D8 can be memory dice for providing memory resource required by the die 20.

Figure 9:
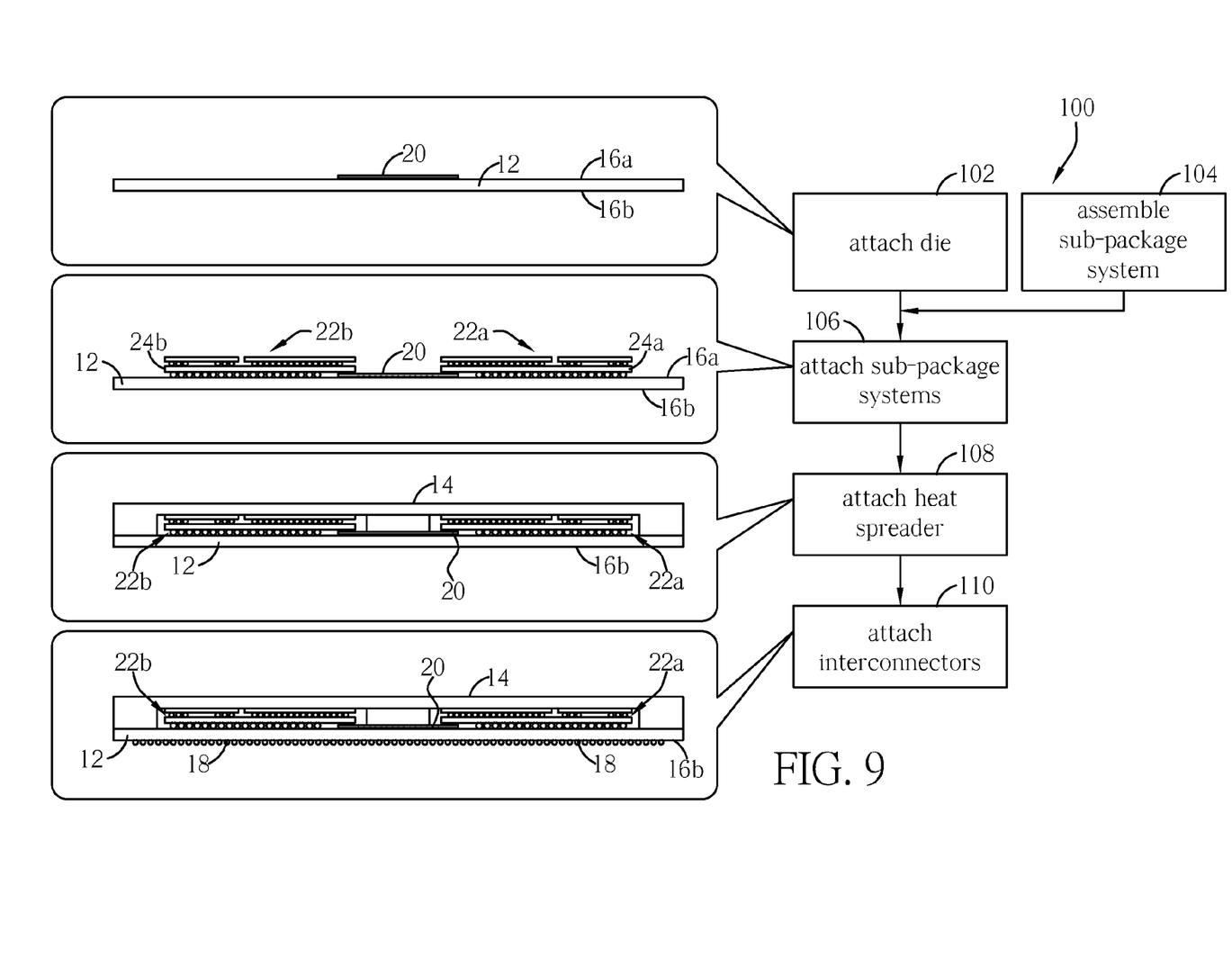
FIG. 9 illustrates a flow to provide the semiconductor device shown in FIG. 1 according to an embodiment of the invention.

Please refer to FIG. 9 illustrating an embodiment of a flow 100 to provide (e.g., assemble, produce, manufacture and/or implement) a semiconductor device of the invention. For an example which implements the semiconductor device 10, main steps of the flow 100 are described as follows.

Step 102: attach (mount) the die 20 to the surface 16a of the substrate 12. As shown in FIG. 4, the interconnectors 32 of the die 20 are fit into to the associated contacts 36; after the interconnectors 32 are coupled to the associated contacts 36, underfill can be injected in-between the interconnectors 32, so the die 20 can be installed on the surface 16a of the substrate 12 by way of flip-chip.

Step 104: assemble each of the sub-package systems 22a and 22b; for example, install the dice D1 to D4 to the interposer 24a. Each of the dice D1 to D4 can be a bare chips and/or a packaged silicon. If the die is a bare chip, it is installed on the interposer 24a by way of flip-chip; if the die is a packaged silicon, it can be installed on the interposer 24a by attaching solder balls of pins. Similarly, install the dice D5 to D8 to the interposer 24b. As shown in FIG. 3, the interconnectors 28 of the dice D1 to D4 can be fit into associated contacts 30 of the interposers 24a; if the dice D1 to D4 are bare chips, underfill (not shown) can be injected between the surface t24a and the surfaces b1 to b4. If the dice D1 to D4 are not bare chips, underfill injection is optional (i.e., can be omitted). Other electric elements, if necessary, can also be installed on the interposers 24a and 24b.

Step 106: attach (mount) the sub-package systems 22a and 22b to the surface 16a of the substrate 12; as shown in FIG. 4, the interconnectors 34 of the sub-package systems 22a and 22b can be fit and coupled into the associated contacts 38 on the substrate 12, so the sub-package systems 22a and 22b can be installed on the surface 16a. Because a portion of the interposers 24a and 24b extends above the die 20, the projections of the sub-package systems 22a and 22b on the surface 16a partially overlap the projection of the die 20, and have a potion not overlapping.

Step 108: attach the heat spreader 14 for installing the heat spreader 14 to the substrate 12, such that the dissipation plate 40 covers the die 20 and the sub-package systems 22a and 22b, and the protrusion portion 46 is set between the die 20 and the dissipation plate 40, as shown in FIG. 4 and FIG. 7. In an embodiment, the side walls 42a and 42b, the protrusion portion 46 and the dissipation plate 40 of the heat spreader 14 are first assembled into one, and are then attached to the substrate 12. In another embodiment, the side walls 42a and 42b, the protrusion portion 46 and the dissipation plate 40 are shaped in a unibody. In another embodiment, the side walls 42a and 42b are first formed on the substrate 12, and then the dissipation plate 14 (and the protrusion portion 46) is assembled to the side walls 42a and 42b.

Step 110: attach the interconnectors 18 to the surface 16b of the substrate 12. The surface 16b of the substrate 12 can include a plurality of contacts (not shown), each contact is associated with an interconnector 18 for mutual coupling; in this step, the interconnectors 18 are coupled to the associated contacts, such that the interconnectors 18 are attached to the substrate 12. Thus, the semiconductor device 10 is completed.

Figure 10:
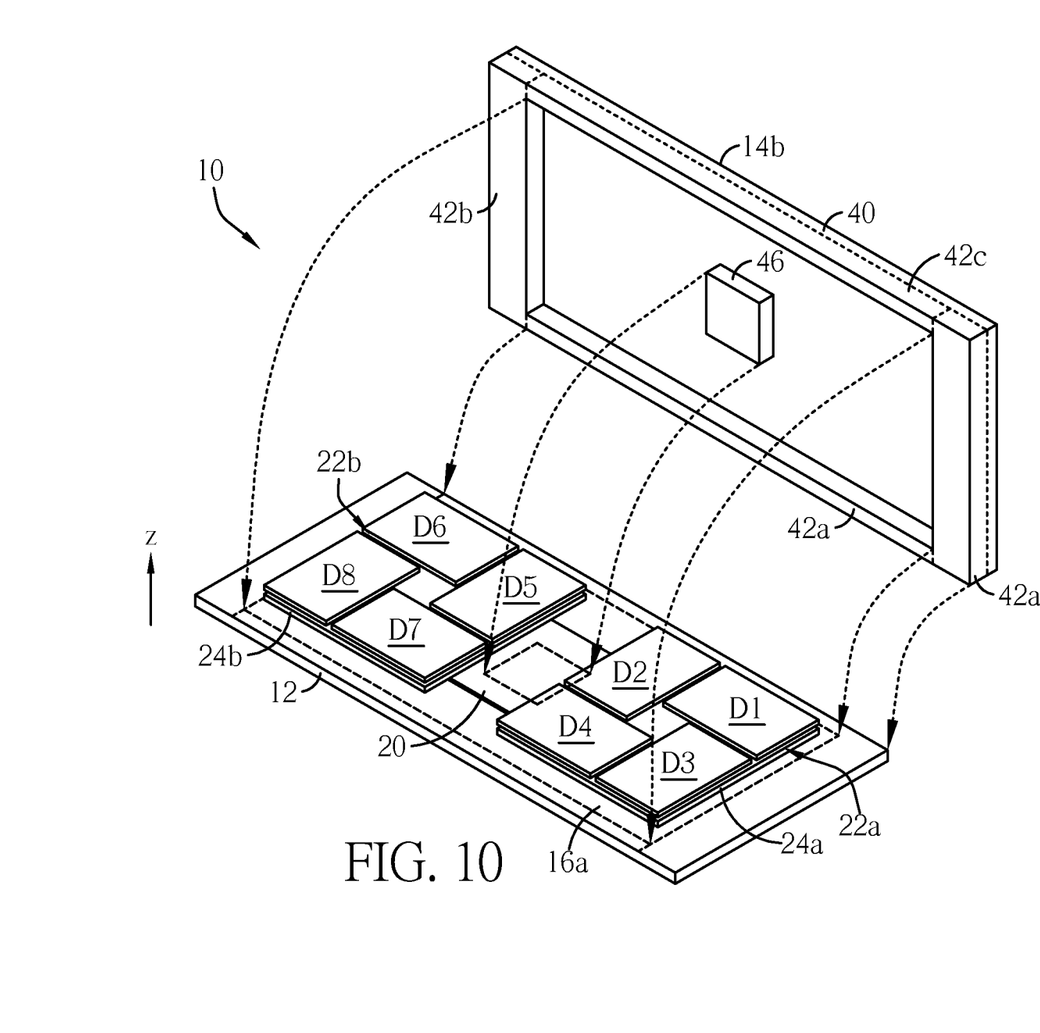
FIG. 10 illustrates another embodiment for the heat spreader shown in FIG. 6.

Please refer to FIG. 10 illustrating another heat spreader 14b according to an embodiment of the invention. Similar to the heat spreader 14 shown in FIG. 6, the heat spreader 14b also includes the protrusion portion 46, the dissipation plate 40 and the side walls 42a and 42b; the heat spreader 14b further includes two additional side walls 42c and 42d, such that the side walls 42a to 42d surround the die 20 and the sub-package systems 22a and 22b.

In the example of FIG. 1 to FIG. 10, a single die 20 is included in the semiconductor device 10. In another embodiment (not shown), the semiconductor device 10 can include multiple dice 20; these dice 20 can be installed between the sub-package systems 22a and 22b, and contact the protrusion portion 46. Wherein, at least one of the dice 20 is covered by the sub-package system(s) 22a and/or 22b.

In the example of FIG. 1 to FIG. 10, the dice D1 to D4 are installed on the interposer 24a of the sub-package system 22a by coupling bumps, solder balls, pins or other kinds of connection structures.

To sum up, comparing to prior arts, the invention not only enhances package integration density of semiconductor devices, but also fulfill heat dissipation demands of each die in the package to ensure proper operation of the electronic system in the package.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:
1. A semiconductor device comprising:
a substrate having a first surface;
a first die installed on the first surface;
at least a sub-package system installed on the first surface, each said sub-package system comprising an interposer;
a projection of each said interposer on the first surface and a projection of the first die on the first surface partially overlapping, and having a portion not overlapping; and a heat spreader comprising a protrusion portion and a dissipation plate having a flat surface; the dissipation plate covering the first die and each said sub-package system, and the protrusion portion extending between the flat surface and the first die along a straight line;

wherein each said sub-package system further comprises:
at least a second die, each second die having a top surface being attached to the flat surface of the heat spreader without reduced cross-section in-between which is smaller than the top surface; and
the interposer of each said sub-package system is set between the first surface and each said second die, with each said second die installed on the interposer.

2. The semiconductor device of claim 1, wherein a plurality of contacts are further installed on the first surface, and each said sub-package system further comprises a plurality of interconnectors, each of the interconnectors and each said second die are respectively installed on opposite surfaces of the interposer, and the interconnectors are respectively coupled between the contacts and the interposer.

3. The semiconductor device of claim 2, wherein the first die is installed on the surface by way of flip-chip; on the first surface, a height of the first die along a first direction is lower than a height of each of the interconnectors along the first direction.

4. The semiconductor device of claim 1, wherein the heat spreader further comprises at least a side wall, each said side wall is attached between the flat surface of the dissipation plate and the first surface.

5. The semiconductor device of claim 1 further comprising a plurality of external interconnectors; the external interconnectors and the first die being installed on opposite surfaces of the substrate.

6. The semiconductor device of claim 1, wherein the second die is a bare chip installed on the interposer by way of flip-chip.

7. The semiconductor device of claim 1, wherein the second die is a packaged silicon, and is installed on the interposer by a solder ball or a pin.

8. A semiconductor device comprising:
a substrate having a first surface;
a first die installed on the first surface;
at least a sub-package system installed on the first surface, a projections of each said sub-package system on the first surface and a projection of the first die on the first surface partially overlapping, and having a portion not overlapping; and
a heat spreader comprising a protrusion portion and a dissipation plate having a flat surface; the dissipation plate covering the first die and each said sub-package system, and the protrusion portion extending between the flat surface and the first die along a straight line;

wherein each said sub-package system further comprises:
at least a second die, each second die having a top surface being attached to the flat surface of the heat spreader without reduced cross-section in-between which is smaller than the top surface; and
the interposer of each said sub-package system is set between the first surface and each said second die.

9. The semiconductor device of claim 8, wherein a plurality of contacts are further installed on the first surface, and each said sub-package system further comprises a plurality of interconnectors, each of the interconnectors and each said second die are respectively installed on opposite surfaces of the interposer, and the interconnectors are respectively coupled between the contacts and the interposer.

10. A method for providing a semiconductor device, comprising:
installing a first die on a first surface of a substrate;
assembling at least a sub-package system, comprising:
for each said sub-package system, installing at least a second die on an interposer,
installing each said sub-package system on the first surface, such that a projection of each said sub-package system on the first surface and a projection of the first die on the first surface partially overlap, and have a portion not overlapping; and
installing a heat spreader which comprises a protrusion portion and a dissipation plate; while installing the heat spreader, covering the dissipation plate over the first die and each said sub-package system, and setting the protrusion portion between the first die and the dissipation plate;
after installing the heat spreader, attaching a plurality of external interconnectors on the substrate, such that the external interconnectors and the first die are installed on opposite surfaces of the substrate.

11. The method of claim 10, wherein a plurality of contacts are further installed on the first surface, and each said sub-package system further comprises a plurality of interconnectors, each of the interconnectors and each said second die are installed on opposite surfaces of the interposer; while installing each said sub-package system, respectively coupling the interconnectors of said sub-package system between the contacts and the interposer.

12. The method of claim 10, wherein the second die is a bare chip installed on the interposer by way of flip-chip.

13. The method of claim 10, wherein the second die is a packaged silicon installed on the interposer by a solder ball or a pin.

* * * * *